(12) United States Patent
Xiao

(10) Patent No.: US 8,884,223 B2
(45) Date of Patent: Nov. 11, 2014

(54) METHODS AND APPARATUS FOR MEASUREMENT OF RELATIVE CRITICAL DIMENSIONS

(71) Applicant: KLA-Tencor Corporation, Milpitas, CA (US)

(72) Inventor: Hong Xiao, Pleasanton, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/772,929

(22) Filed: Feb. 21, 2013

(65) Prior Publication Data

US 2014/0151551 A1 Jun. 5, 2014

Related U.S. Application Data

(60) Provisional application No. 61/731,580, filed on Nov. 30, 2012.

(51) Int. Cl.
*H01J 37/22* (2006.01)
*G06K 9/46* (2006.01)

(52) U.S. Cl.
CPC .................................. *H01J 37/222* (2013.01)
USPC ............................ 250/307; 250/310; 382/145

(58) Field of Classification Search
USPC .................. 250/306, 307, 310, 311; 382/145
See application file for complete search history.

(56) References Cited

U.S. PATENT DOCUMENTS

| 5,962,867 | A | 10/1999 | Liu |
| 6,774,365 | B2 | 8/2004 | Okoroanyanwu et al. |
| 6,784,425 | B1 | 8/2004 | Lorusso et al. |
| 7,525,089 | B2 * | 4/2009 | Choi et al. ................... 250/307 |
| 8,294,125 | B2 | 10/2012 | Han et al. |
| 2002/0000550 | A1 * | 1/2002 | Yang et al. ....................... 257/48 |
| 2003/0059104 | A1 * | 3/2003 | Mitsui ............................ 382/145 |
| 2006/0251317 | A1 * | 11/2006 | Eran et al. ...................... 382/144 |
| 2007/0202615 | A1 | 8/2007 | Lee et al. |
| 2008/0319696 | A1 * | 12/2008 | Tanaka et al. ................... 702/97 |

(Continued)

FOREIGN PATENT DOCUMENTS

| KR | 10-2006-0017087 | 2/2006 |
| KR | 10-2010-0024087 | 3/2010 |

OTHER PUBLICATIONS

Rodriguez, German. "Smoothing and Parametric Regression", http://data.princeton.edu/eco572/smoothing.pdf, Spring 2001.*

(Continued)

*Primary Examiner* — Nicole Ippolito
*Assistant Examiner* — David E Smith
(74) *Attorney, Agent, or Firm* — Okamoto & Benedicto LLP

(57) ABSTRACT

One embodiment relates to a method of measuring a relative critical dimension (RCD) during electron beam inspection of a target substrate. A reference image is obtained. A region of interest is defined in the reference image. A target image is obtained using an electron beam imaging apparatus. The target and reference images are aligned, and the region of interest is located in the target image. Measurement is then made of the RCD within the region of interest in the target image. Another embodiment relates to a method of measuring a RCD which involves scanning along a scan length that is perpendicular to the RCD. Point RCDs along the scan length are measured. A filter is applied to the point RCDs, and an average of the point RCDs is computed. Other embodiments, aspects and features are also disclosed.

21 Claims, 9 Drawing Sheets

(56) References Cited

U.S. PATENT DOCUMENTS

2010/0158345 A1\* 6/2010 Kitamura et al. ............. 382/145
2012/0105617 A1 5/2012 Yoon et al.
2012/0174045 A1\* 7/2012 Koshiba et al. ................ 716/52
2012/0212601 A1 8/2012 Fang et al.

OTHER PUBLICATIONS

PCT International Search Report and Written Opinion of the International Searching Authority for Application No. PCT/US2013/071733, Mar. 21, 2014, 8 sheets.

\* cited by examiner

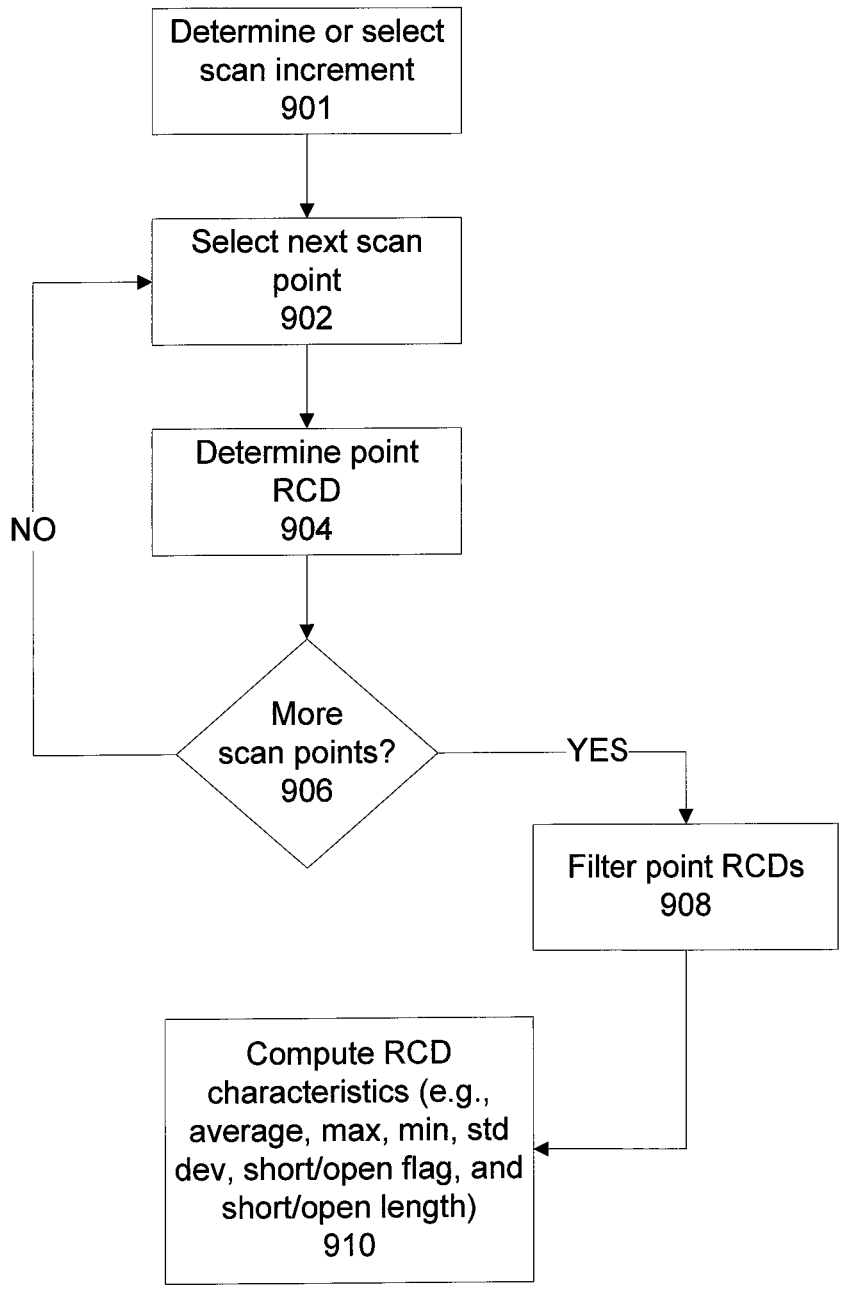
FIG. 9    900

METHODS AND APPARATUS FOR MEASUREMENT OF RELATIVE CRITICAL DIMENSIONS

CROSS-REFERENCE TO RELATED APPLICATION(S)

The present application claims the benefit of U.S. provisional patent application No. 61/731,580, entitled "Relative Critical Dimension Measurement for Hotspot Inspection and Control," filed Nov. 30, 2012 by inventor Hong Xiao, the disclosure of which is hereby incorporated by reference.

BACKGROUND OF THE INVENTION

1. Field of the Invention

The present invention relates to inspection and review of substrates, such as, for example, semiconductor wafers and reticles.

2. Description of the Background Art

In a conventional charged-particle beam instrument, such as an electron beam (e-beam) inspection instrument, a manufactured substrate (such as a silicon wafer or a reticle) is scanned with a focused beam of electrons which results in the emission of secondary electrons from the substrate surface. The emitted electrons are detected, and the detection data is typically converted into images of the surface of the specimen. These images are then analyzed numerically to detect abnormalities (referred to as defects) in the manufactured substrate.

SUMMARY

One embodiment relates to a method of measuring a relative critical dimension (RCD) during electron beam inspection of a target substrate. A reference image is obtained. A region of interest is defined in the reference image. A target image is obtained using an electron beam imaging apparatus. The target and reference images are aligned, and the region of interest is located in the target image. Measurement is then made of the RCD within the region of interest in the target image.

Another embodiment relates to a method of measuring a RCD which involves scanning along a scan length that is perpendicular to the RCD. Point RCDs along the scan length are measured. A filter is applied to the point RCDs, and an average of the point RCDs is computed.

Another embodiment relates to an apparatus including a source for generating an incident electron beam, a scanning system for controllably deflecting the incident electron beam to scan the incident electron beam over a surface such that secondary electrons are emitted therefrom, and a detection system for detecting the secondary electrons so as to generate an image data. The apparatus further includes a control and processing system that is programmed to obtain a reference image, define a region of interest in the reference image, obtain a target image, align the target and reference images, locate the region of interest in the target image, and measure a RCD within the region of interest in the target image.

Other embodiments, aspects and features are also disclosed.

BRIEF DESCRIPTION OF THE DRAWINGS

FIG. 9 is a flow diagram of a method of measuring a relative critical dimension within an ROI in accordance with an embodiment of the invention.

DETAILED DESCRIPTION

Methods and apparatus for the measurement of relative critical dimensions using a charged-particle beam apparatus are disclosed herein. These methods and apparatus may be employed advantageously in conjunction with "hot spot" defect inspection.

Figure 1:
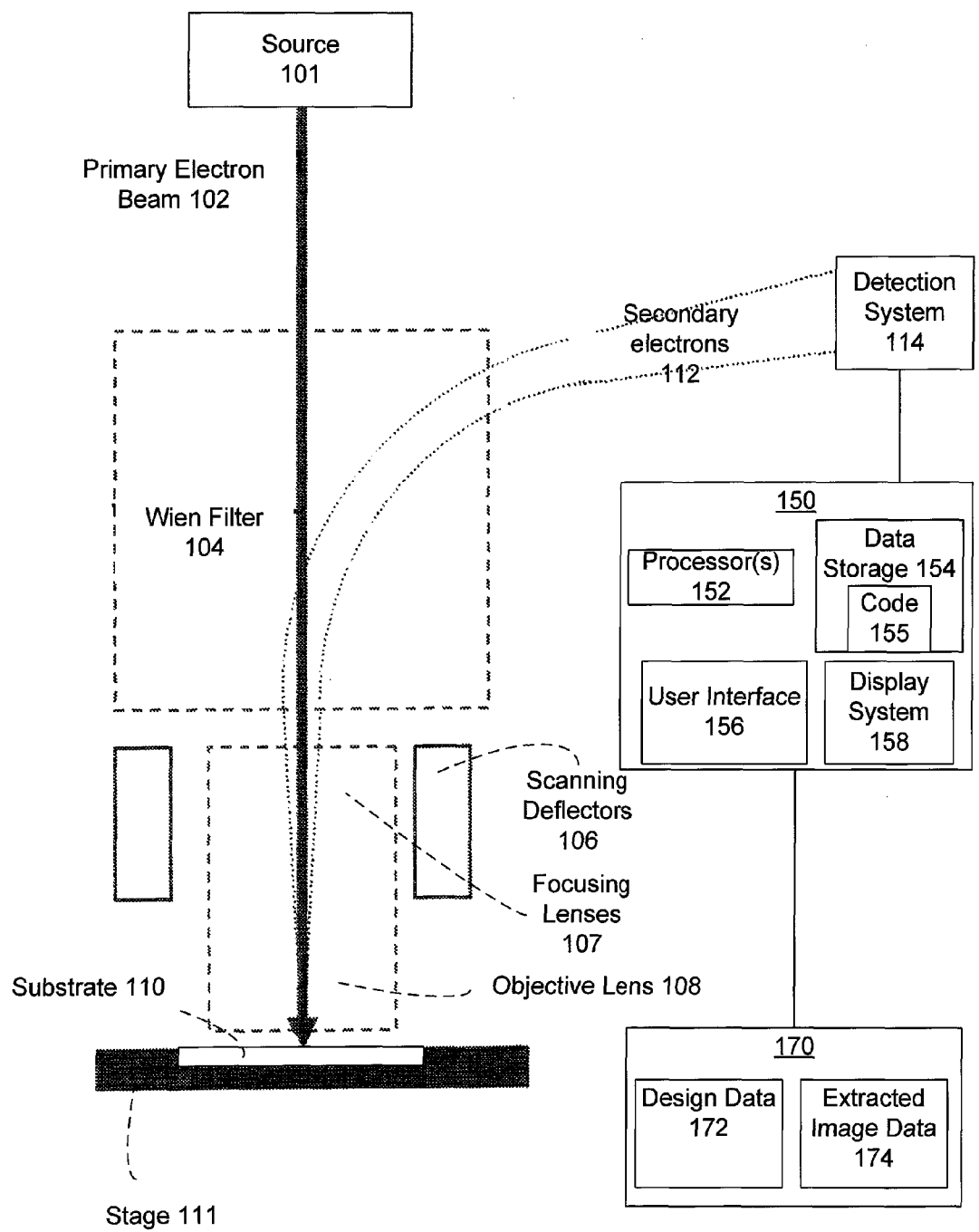
FIG. 1 is a schematic diagram of an charged-particle beam apparatus in accordance with an embodiment of the invention.

FIG. 1 provides a cross-sectional diagram of the charged-particle beam imaging apparatus 100 based on a scanning electron microscope (SEM) which may be utilized in accordance with an embodiment of the invention. As shown in FIG. 1, a source 101 generates an incident electron beam (primary electron beam) 102. The incident charged particle beam, electron beam 102, passes through a Wien filter 104. The Wien filter 104 is an optical element configured to generate electrical and magnetic fields which cross each other. Scanning deflectors 106 and focusing electron lenses 107 are utilized. The scanning deflectors 106 are utilized to scan the charged-particle beam across the surface of the target substrate 110. The target substrate 110 may be, for example, a patterned substrate, such as an integrated circuit being manufactured or a reticle for lithography.

The focusing electron lenses 107 are utilized to focus the incident electron beam 102 into a beam spot on the surface of the wafer or other substrate sample 110. In accordance with one embodiment, the focusing lenses 107 may operate by generating electric and/or magnetic fields.

As a result of the scanning of the incident electron beam 102, secondary electrons are emitted or scattered from the surface of the target substrate 110 (which may be, for example, a semiconductor wafer or a reticle). The target substrate 110 may be held by a movable stage 111. The secondary electrons are then extracted from the target substrate 110 by exposure to the electromagnetic field of the objective (final) lens 108. The electromagnetic field acts to confine the emitted electrons to within a relatively small distance from the incident electron beam optic axis and to accelerate these electrons up into the column. In this way, a secondary electron beam 112 is formed from the secondary electrons.

The Wien filter 104 deflects the secondary electrons 112 from the optic axis of the incident electron beam 102 to a detection axis (the optic axis for the detection system 114 of the apparatus). This serves to separate the secondary electrons 112 from the incident electron beam 102. The detection system 114 detects the secondary electrons 112 and generates data signals that may be utilized to create images of the surface of the target substrate.

An instrument control and data processing (control/processing) system 150 may include one or more processors (i.e. microprocessors or microcontrollers) 152, data storage (including, for example, hard disk drive storage and memory chips) 154, a user interface 156 and a display system 158. The data storage 154 may be configured to store or hold computer-readable program code (instructions) 155 and data, and the processor 152 may be configured to execute the program code 155 and process the data. The user interface 156 may be configured to receive user inputs. The display system 158 may be configured to display views of the substrate surface to a user.

The control/processing system 150 may be connected to, and may be used to control, various components of the charged-particle beam column so as to implement procedures disclosed herein. For example, the movement of the stage 111, and the scanning by the deflectors 106 may be controlled by computer-readable program code 155 executed by the control/processing system 150.

In addition, the control/processing system 150 may be configured to receive and process the electron image data from the detection system 114. In particular, the computer-readable program code 155 in the control/processing system 150 may be used to implement procedures relating to the relative critical dimension measurement technique which is described herein.

Furthermore, in accordance with an embodiment of the invention, the control/processing system 150 may be configured to interface with a data server 170. The data server 170 may be configured to store design pattern data 172 and extracted image data 174. During an inspection run, the data server 170 may provide said data in real time at the request of the control/processing system 150 of the charged-particle beam imaging apparatus 100.

Figure 2:
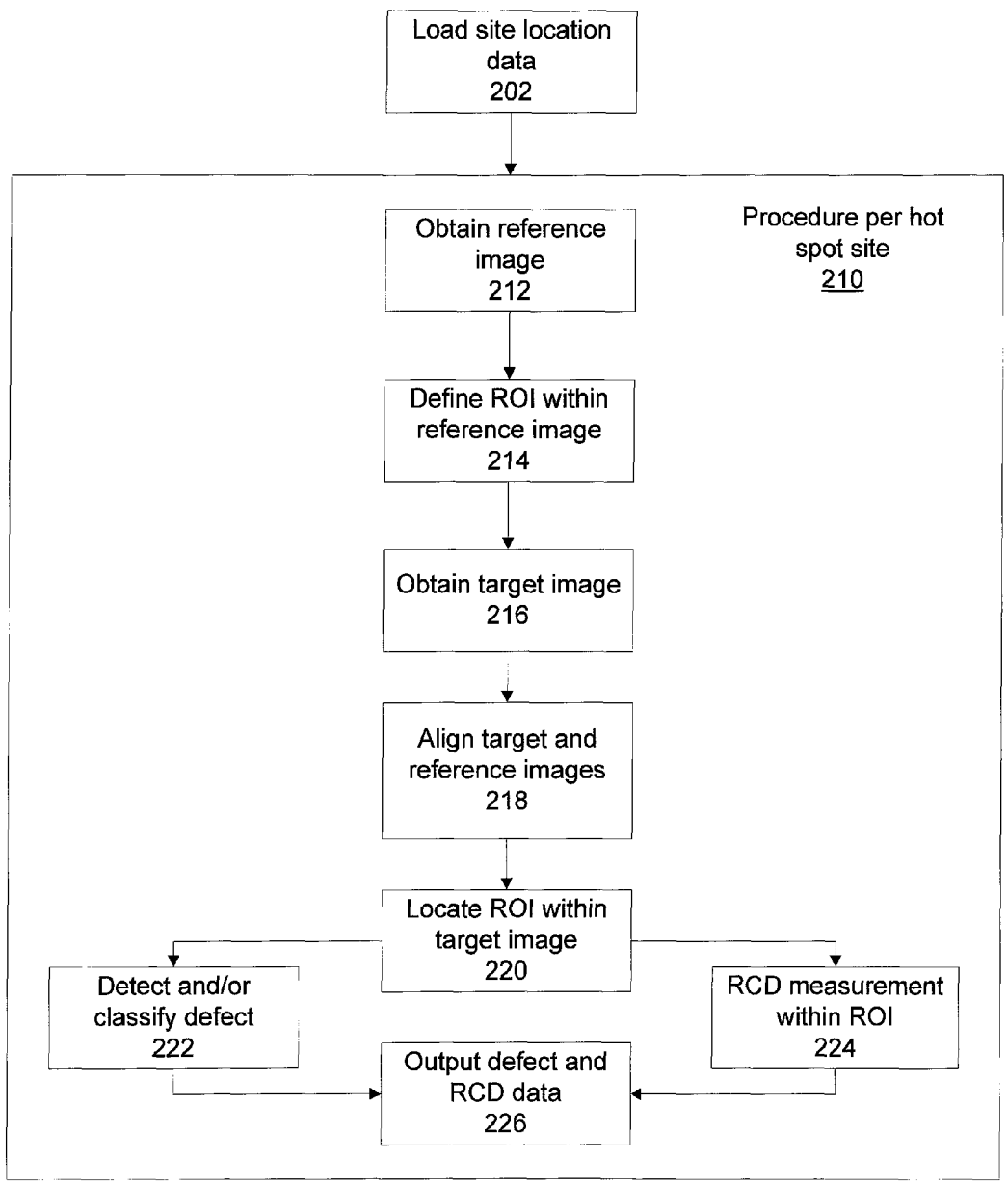
FIG. 2 is a flow diagram of a method for the measurement of a relative critical dimension in conjunction with hot spot defect inspection in accordance with an embodiment of the invention.

FIG. 2 is a flow diagram of a method 200 for the measurement of a relative critical dimension in conjunction with defect inspection in accordance with an embodiment of the invention. The method 200 may be performed using the charged-particle beam imaging apparatus 100, for example.

Per step 202, site location information (i.e. the locations of the sites to be inspected) may be loaded by the data processing system from a source. The site location information may be, for example, "hots spots" of a design rule check.

Alternatively, the site location information may comprise defect locations in inspection results from a previous inspection by the charged-particle beam imaging apparatus 100 or by another inspection apparatus.

For each site location, a procedure 210 for hot spot inspection and RCD measurement may be performed. As shown, the procedure 210 may involve performing the following steps.

Per step 212, a reference image may be loaded into a data processing system, such as the control/processing system 150, for example. In one embodiment, the reference image may be a SEM image that is acquired from a reference site by an imaging apparatus, such as the charged-particle beam imaging apparatus 100, for example. The reference site is preferably a known good (defect free) site that corresponds to an inspection site. In another embodiment, the reference image may be rendered from design data which may be retrieved by the charged-particle beam imaging apparatus 100 from the data server 170, for example.

Figure 3:
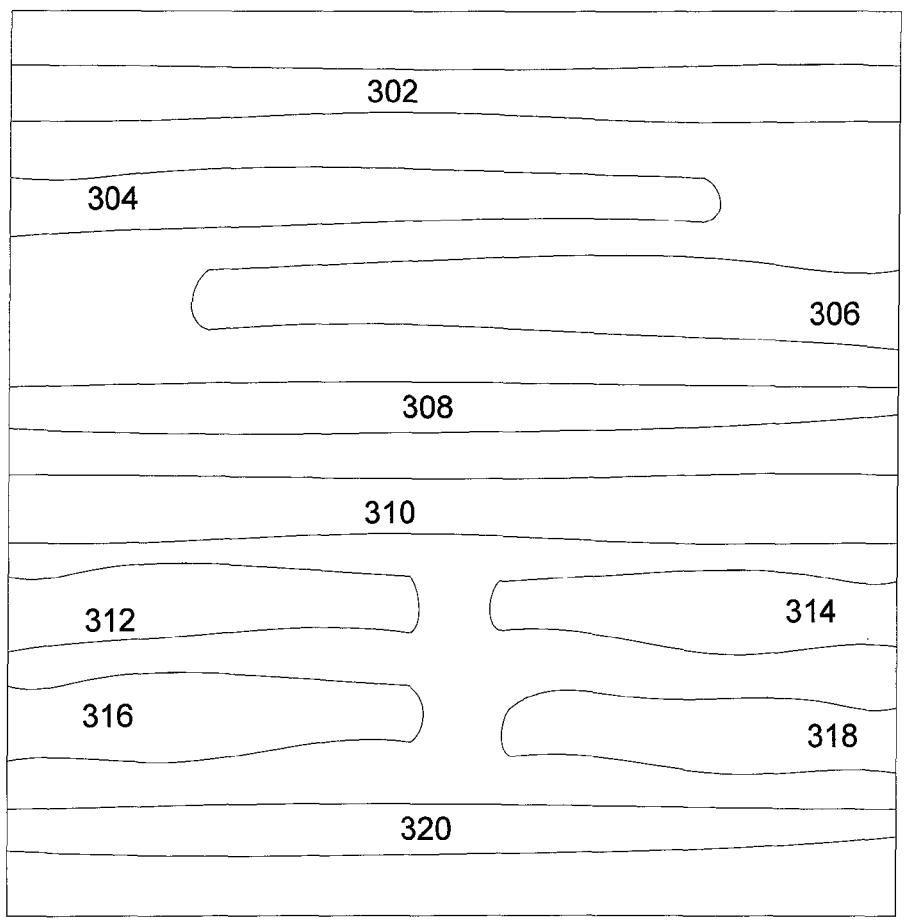
FIG. 3 depicts an illustrative example of a reference image from a reference site inspection in accordance with an embodiment of the invention.

An illustrative example of a reference image from a reference site is shown in FIG. 3. As depicted, the reference image 300 may include multiple features (302, 304, 306, 308, 310, 312, 314, 316, 318, and 320). While illustrative example shows only the outline of each feature, each feature may be distinguishable in the reference image by contrast against the background or surrounding pixels. For example, each feature may have darker pixels against a background of lighter pixels of the reference image. Alternatively, each feature may have lighter pixels against a background of darker pixels. For SEM images, lighter pixels typically correspond to a greater intensity of secondary electrons detected, and darker pixels typically correspond to a lower intensity of secondary electrons detected.

Figure 4:
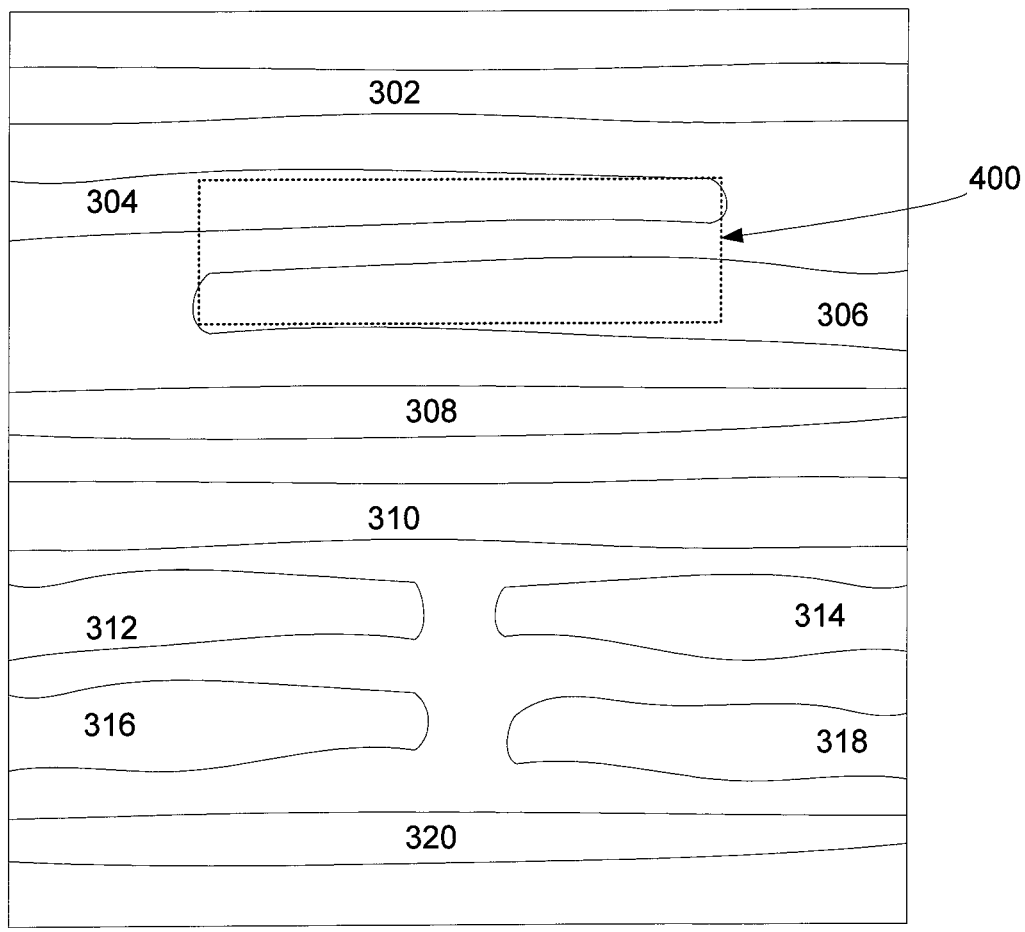
FIG. 4 depicts an illustrative example of a region of interest (ROI) within a reference image inspection in accordance with an embodiment of the invention.

Per step 214, a region of interest (ROI) within the reference image may be defined. An illustrative example of a ROI 400 within a reference image is shown in FIG. 4. As depicted, the ROI 400 may be a rectangular shape. In this particular example, the ROI 400 includes portions of two features (304 and 306) that are adjacent or nearby each other.

Per step 216, a target image of the inspection site may be collected or acquired. The target image may be an SEM image and may be collected using the charged-particle beam imaging apparatus 100, for example.

Figure 5:
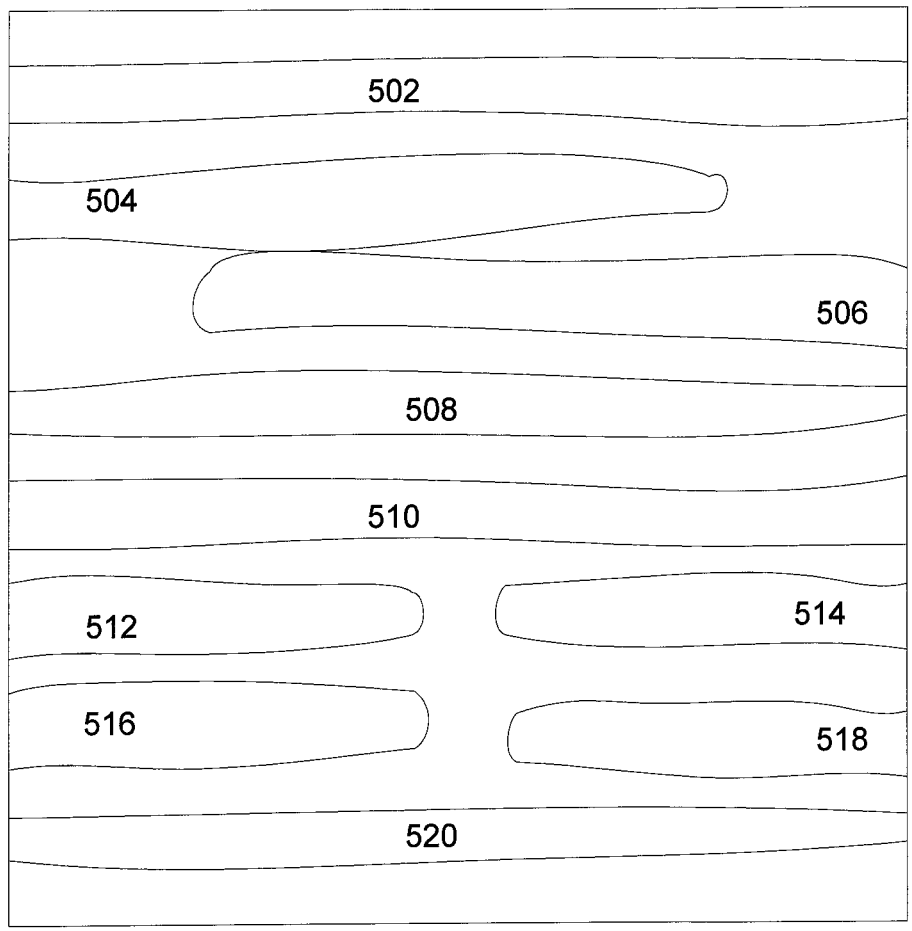
FIG. 5 depicts an illustrative example of a target image of an inspection site inspection in accordance with an embodiment of the invention.

An illustrative example of a target image 500 is shown in FIG. 5. This target image 500 corresponds to the reference image 300 depicted in FIG. 3. As depicted, the target image 400 may include multiple features (502, 504, 506, 508, 510, 512, 514, 516, 518, and 520) which correspond to (but may vary somewhat from) the multiple features (302, 304, 306, 308, 310, 312, 314, 316, 318, and 320) in the reference image 300. Again, while illustrative example shows only the outline of each feature, each feature may be distinguishable in the reference image by contrast against the background or surrounding pixels.

Per step 218, the target image and the reference image may be aligned to each other. The alignment process may involve, for example, shifting the positioning of the target image relative to the reference image until there is a good match between them. The goodness of the match may be determined, for example, by a least squares fit. Other alignment processes may be used in other implementations.

Figure 6:
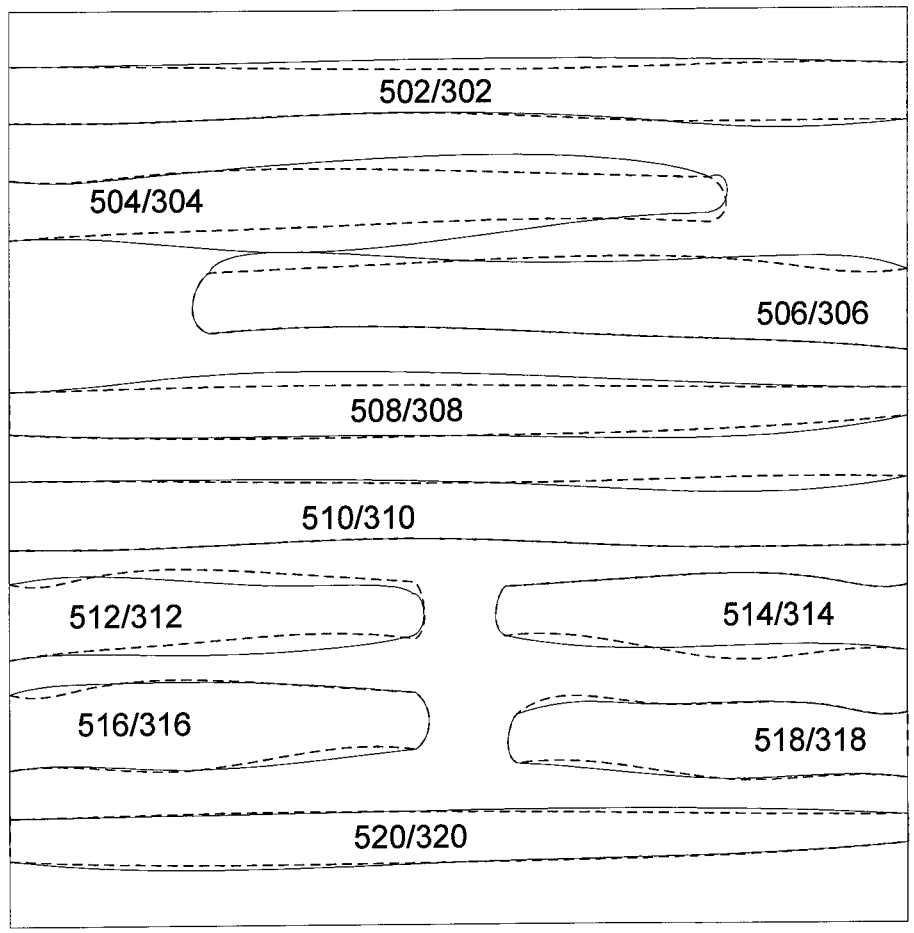
FIG. 6 depicts an illustrative example showing target and reference images that are aligned to each other inspection in accordance with an embodiment of the invention.

An illustrative example showing target and reference images that are aligned to each other is depicted in FIG. 6. In FIG. 6, the outlines of the features (502 through 520) of the target image are shown in solid lines, while the outlines of the matching features (302 through 320, respectively) from the reference image are shown in dashed lines. As shown, the target and reference features correspond to each other, but they may differ in their exact shapes and positioning.

Figure 7:
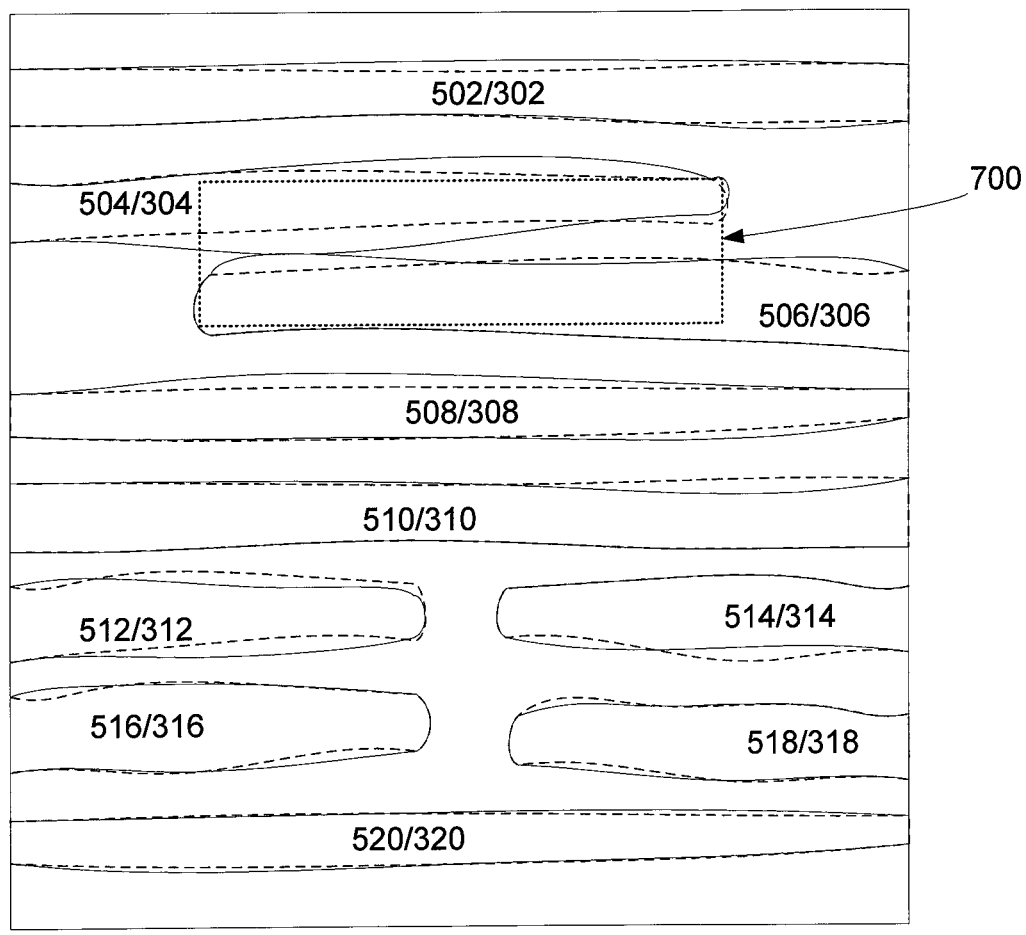
FIG. 7 depicts an illustrative example showing an ROI located in the target image in accordance with an embodiment of the invention.

Per step 220, the ROI 700 may be located in the target image 500, as depicted in FIG. 7. In this particular example, the ROI 700 includes portions of the two target features (504 and 506) that correspond to the two reference features (304 and 306, respectively) in the corresponding ROI 400 located in the reference image 300.

Per step 222, an inspection or review procedure may be performed to determine whether the ROI has a defect and/or to classify the defect. This procedure may be performed using existing techniques.

Per step 224, a relative critical dimension (RCD) measurement may be performed. The RCD measurement may be performed to determine a RCD for a specified feature within the ROI. The RCD measurement per step 224 may be performed in parallel with the defect detection and/or classification per step 222.

Figure 8:
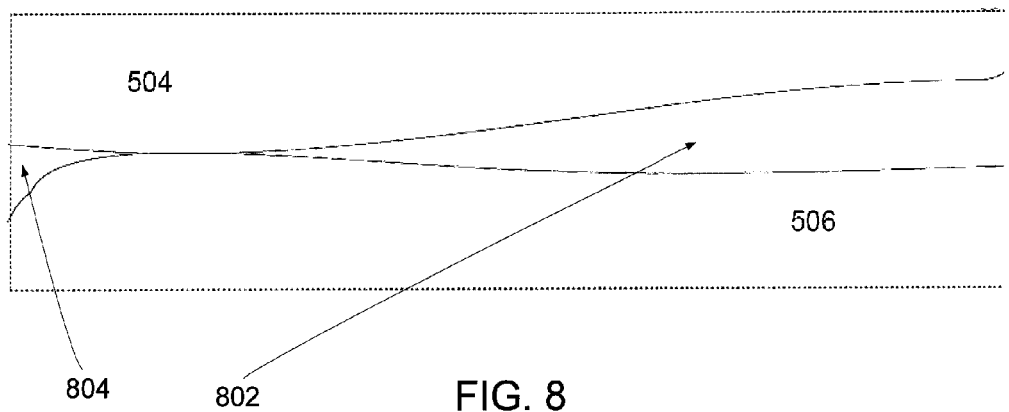
FIG. 8 depicts an illustrative example of a gap feature within an ROI located in the target image in accordance with an embodiment of the invention.

In an illustrative example, the specified feature may be the width of the gap feature between edges of the two line features (504 and 506) in the ROI 700. This gap feature is depicted in FIG. 8. In this example, there are two gap portions (802 and 804) in between which the gap appears to be closed. In another example, the specified feature may be a line, rather than a gap.

The RCD of the specified feature (for example, the width of a gap or a line) may be measured relative to a pixel size. In other words, the RCD of the specified feature may be determined in terms of a number of pixels. The number of pixels may be converted to a distance (for example, in nanometers) based on the magnification of the image. Such a feature width which is based on the image pixels may be referred to as an RCD measurement because it is a measurement relative to the image pixels rather than an absolute measurement in nanometers.

In accordance with an embodiment of the invention, the RCD may be measured in accordance with the exemplary method 900 shown in FIG. 9. Alternatively, other similar methods may be utilized.

In the exemplary method 900, the specified feature may be scanned along a length that is perpendicular to the critical dimension (the length being referred to herein as the "scan length" or the "perpendicular length"). The scanning may be done increments of one or more pixels. For example, the length perpendicular to the RCD within the ROI may be 1024 pixels long and may be numbered 1 through 1024. In this case, scanning in increments of one pixel would result in 1024 scan points, and scanning in increments of two pixels would result in 512 scan points, and so on. An increment for the scanning may be determined or selected per step 901. It is anticipated that a scan increment of one pixel may be typically selected.

Per step 902, a next scan point along the perpendicular length may be selected. The RCD at the scan point (the "point RCD") may then be measured per step 904. The point RCD may be measured in terms of a number of pixels. Example point RCDs 1002 for the example gap feature between two lines (504 and 506) are illustrated by the arrows in FIG. 10.

Figure 10:
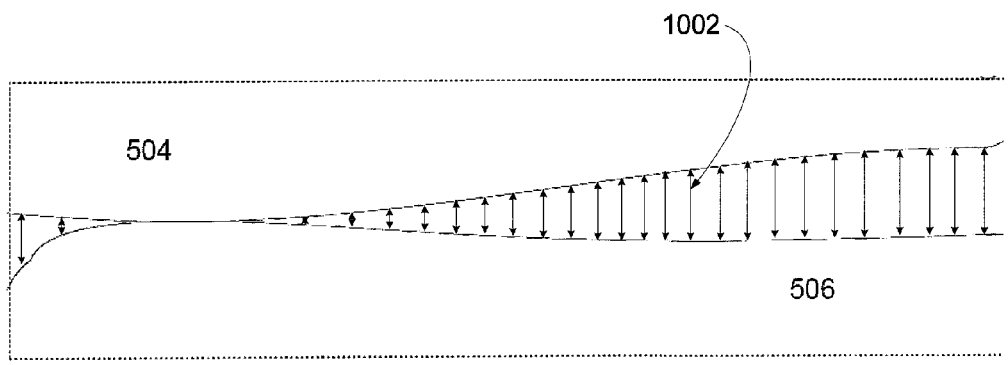

In the example shown in FIG. 10, each point RCD may be measured by considering the vertical column of pixels at the horizontal scan point. A derivative may be performed on the pixel intensities in the column of pixels so as to determine a function indicative of the change of pixel intensity along the column. Positive and negative thresholds may then be applied to the change of pixel intensity to select the start and end pixels of the specified feature at that point. The point RCD may then be determined as a number of pixels from the start pixel to the end pixel.

The method 900 may continue to select a next scan point along the perpendicular length and measure the point RCD at the scan point, until it is determined per step 906 that there are no further scan points to be selected. In accordance with an embodiment of the invention, once all the point RCDs have been measured, then optional filtering may be performed on the point RCD data per step 908.

In one embodiment, the filter applied may be a nearest-neighbor (NN) filter. The NN filter may average each point RCD with its nearest-neighbor point RCDs. In other words, the NN filtered point RCD for scan point j may be the average of the three raw point RCDs for scan points j−1, j and j+1. Alternatively, the NN filter may weight the raw point RCD for the middle point j by a weighting factor. For example, if the weighting factor is two, then the NN filtered point RCD for scan point j may effectively average the four raw point RCDs for scan points j−1, j, j and j+1.

In another embodiment, the filter applied may be a next-nearest-neighbor (NNN) filter. A NNN filter may average each point RCD with its nearest-neighbor and next-nearest-neighbor point RCDs. In other words, the NNN filtered point RCD for scan point j may be the average of the five raw point RCDs for scan points j−2, j−1, j, j+1 and j+2. Alternatively, the NNN filter may weight the raw point RCD for the middle point j by a weighting factor. For example, if the weighting factor is two, then the NNN filtered point RCD for scan point j may effectively average the six raw point RCDs for scan points j−2, j−1, j, j, j+1 and j+2.

In another embodiment, the filter applied may be a next-next-nearest-neighbor (NNNN) filter. A NNNN filter may average each point RCD with its nearest-neighbor, next-nearest-neighbor, and next-next-nearest-neighbor point RCDs. In other words, the NNNN filtered point RCD for middle point j may be the average of the seven raw point RCDs for scan points j−3, j−2, j−1, j, j+1, j+2 and j+3. Alternatively, the NNNN filter may weight the raw point RCD for scan point j by a weighting factor. For example, if the weighting factor is two, then the NNNN filtered point RCD for scan point j may effectively average the eight raw point RCDs for scan points j−3, j−2, j−1, j, j, j+1, j+2 and j+3.

The boundary values may be dealt with in various ways. Consider that there are M scan points such that j ranges from 1 to M. One way to deal with boundary values is described below, but other implementations are also possible.

In one implementation, non-existent nearest neighbor scan points may be ignored in computing the averages. For example, the NN filtered point RCD (without weighting of the middle point) may be computed at scan point 1 to be the average of the two point RCDs for scan point 1 and 2 and may be computed at scan point M to be the average of the two point RCDs for scan points M−1 and M. As another example, the NN filtered point RCD with double weighting of the middle point may be computed at scan point 1 to effectively average the three point RCDs for scan point 1, 1 and 2 and may be computed at scan point M to effectively average the three point RCDs for scan points M−1, M and M.

Returning to FIG. 9, after the optional filtering per step 908, various RCD characteristics may be computed per step 910. In one embodiment, the RCD characteristics include an average RCD, a maximum RCD, a minimum RCD, and a standard deviation for the RCD, a short/open flag, and a short/open length.

Each RCD characteristic may be computed based on the raw and/or filtered point RCD data. The average RCD may be computed by averaging all the raw point RCDs, or alternatively all the filtered point RCDs. The minimum RCD may be determined by finding the shortest raw point RCD, or alternatively finding the shortest filtered point RCD. The maximum RCD may be determined by finding the longest raw point RCD, or alternatively finding the longest filtered point RCD. The standard deviation may be computed as the standard deviation of the raw point RCDs, or alternatively as the standard deviation of the filtered point RCDs.

The short/open flag may be used to indicate whether there is a closed gap indicative of a short circuit between two lines or a broken line indicative of an open circuit. The short/open flag may be set if the minimum RCD is determined to be zero. The short/open length may be provided if the short/open flag is set. The short/open length may be computed, for example, based on the number of pixels along the length of the gap or line having zero for the point RCD (either raw or filtered). In other words, the run length of the short/open may be computed and output.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. A method of measuring a relative critical dimension during electron beam inspection of a target substrate, the method comprising:
    obtaining a reference image;
    defining a region of interest in the reference image;
    obtaining a target image using an electron beam imaging apparatus;
    aligning the target and reference images;
    locating the region of interest in the target image; and
    measuring a relative critical dimension (RCD) within the region of interest in the target image, wherein measuring the RCD comprises
        scanning along a scan length that is perpendicular to the RCD, and
        measuring point RCDs along the scan length, wherein measuring a point RCD comprises
            performing a derivative on pixel intensities in a vertical column of pixels at a horizontal scan point to determine a function indicative of a change in pixel intensity along the vertical column of pixels, and
            applying positive and negative thresholds to the change in the pixel intensity.

2. The method of claim 1, wherein measuring the RCD further comprises:
    averaging the point RCDs.

3. The method of claim 2 further comprising:
    applying a filter to the point RCDs.

4. The method of claim 3, wherein the filter comprises a nearest-neighbor type filter that averages the point RCD with neighboring point RCDs.

5. The method of claim 4, wherein the nearest-neighbor type filter averages the point RCD with a preceding point RCD and a subsequent point RCD along the scan length.

6. The method of claim 4, wherein the nearest-neighbor type filter averages the point RCD with two preceding point RCDs and two subsequent point RCDs along the scan length.

7. The method of claim 4, wherein the nearest-neighbor type filter averages the point RCD with three preceding point RCDs and three subsequent point RCDs along the scan length.

8. The method of claim 4, wherein the nearest-neighbor type filter weights the point RCD.

9. The method of claim 2 further comprising:
    determining if the point RCDs include a zero value to detect a short/open characteristic.

10. The method of claim 9 further comprising:
    computing a run length of the short/open characteristic.

11. The method of claim 2 further comprising:
    computing a minimum RCD, a maximum RCD and a standard deviation for the RCD.

12. An apparatus comprising:
    a source for generating an incident electron beam;
    a scanning system for controllably deflecting the incident electron beam to scan the incident electron beam over a surface such that secondary electrons are emitted therefrom;
    a detection system for detecting the secondary electrons so as to generate an image data; and
    a control and processing system programmed to
        obtain a reference image,
        define a region of interest in the reference image,
        obtain a target image,
        align the target and reference images,
        locate the region of interest in the target image, and
        measure a relative critical dimension (RCD) within the region of interest in the target image, wherein the RCD is measured by
            scanning along a scan length that is perpendicular to the RCD, and
            measuring point RCDs along the scan length, wherein a point RCD is measured by
                performing a derivative on pixel intensities in a vertical column of pixels at a horizontal scan point to determine a function indicative of a change in pixel intensity along the vertical column of pixels, and
                applying positive and negative thresholds to the change in the pixel intensity.

13. The apparatus of claim 12, wherein the control and processing system is further programmed to measure the RCD by averaging the point RCDs along the scan length.

14. The apparatus of claim 13, wherein the control and processing system is further programmed to apply a filter to the point RCDs.

15. The apparatus of claim 14, wherein the filter comprises a nearest-neighbor type filter that averages the point RCD with neighboring point RCDs.

16. The apparatus of claim 15, wherein the nearest-neighbor type filter weights the point RCD.

17. The apparatus of claim 13, wherein the control and processing system is further programmed to determine if the point RCDs include a zero value to detect a short/open characteristic.

18. The apparatus of claim 17, wherein the control and processing system is further programmed to compute a run length of the short/open characteristic.

19. The apparatus of claim 13, wherein the control and processing system is further programmed to compute a minimum RCD, a maximum RCD and a standard deviation for the RCD.

20. A method of measuring a relative critical dimension (RCD), the method comprising:
    scanning along a scan length that is perpendicular to the RCD;
    measuring point RCDs along the scan length, wherein measuring a point RCD comprises
        performing a derivative on pixel intensities in a vertical column of pixels at a horizontal scan point to determine a function indicative of a change in pixel intensity along the vertical column of pixels, and
        applying thresholds to the change in the pixel intensity;
    applying a filter to the point RCDs; and
    averaging the point RCDs.

21. The method of claim 20, wherein the filter comprises a nearest-neighbor type filter that averages the point RCD with neighboring point RCDs.

\* \* \* \* \*